United States Patent [19]
Walding

[11] 3,932,867
[45] Jan. 13, 1976

[54] TELEVISION CHANNEL INDICATOR

[75] Inventor: Eugene C. Walding, Arlington Heights, Ill.

[73] Assignee: Oak Electro/Netics Corporation, Crystal Lake, Ill.

[22] Filed: May 8, 1972

[21] Appl. No.: 251,461

[52] U.S. Cl............... 340/378 R; 340/336; 325/455
[51] Int. Cl.²........................................... G08B 5/00
[58] Field of Search..... 340/379, 378, 324 B, 324 S, 340/336; 325/455; 116/124.1 R, 124.2; 235/92 EA; 178/DIG. 15, 6

[56] References Cited
UNITED STATES PATENTS 3,624,362  11/1971  Kelch .......................... 235/92 EA
3,671,869  6/1972  Wolfram ........................... 325/455

*Primary Examiner*—Donald J. Yusko
*Assistant Examiner*—William M. Wannisky
*Attorney, Agent, or Firm*—Kinzer, Plyer, Dorn & McEachran

[57] ABSTRACT

The present invention relates to a television channel indicator and particularly to an indicator using a pair of readout devices, such as Nixie tubes, to give a visual indication of the selected television channel. A pair of coded surfaces are positioned on opposite sides of a disc fixed to the channel selector shaft with the voltage outputs from the coded surfaces being connected directly to the readout devices.

3 Claims, 3 Drawing Figures

TELEVISION CHANNEL INDICATOR

SUMMARY OF THE INVENTION

The present invention relates to a television channel selector and particularly to an improved means for displaying a numerical indicator of the channel selected.

A primary purpose of the invention is a television channel selector of the type described in which the channel indicating devices, for example electrically-operated tubes or the like, are directly connected to coded surfaces rotatable with the channel selector device.

Another purpose is a simply constructed, reliably operable television channel indicator.

Another purpose is a television channel indicator in which a pair of coded surfaces are positioned on opposite sides of a rotatable disc, with the pickup devices cooperating with the coded surfaces being connected directly to the visual readout tubes.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

The invention basically provides a pair of coded surfaces, preferably mounted on opposite sides of a disc fixed to the channel selector shaft. The pickups, associated with each of the coded surfaces, are directly connected to a readout device, such as a Nixie tube, thus eliminating the conventional character generator which has in the past been connected between the coded surfaces and the readout device. To provide such a direct connection it is necessary to increase the number of pickup devices associated with the coded surfaces. The shaft encoding utilizes seven-bit logic rather than the conventional four-bit logic.

Figure 1:
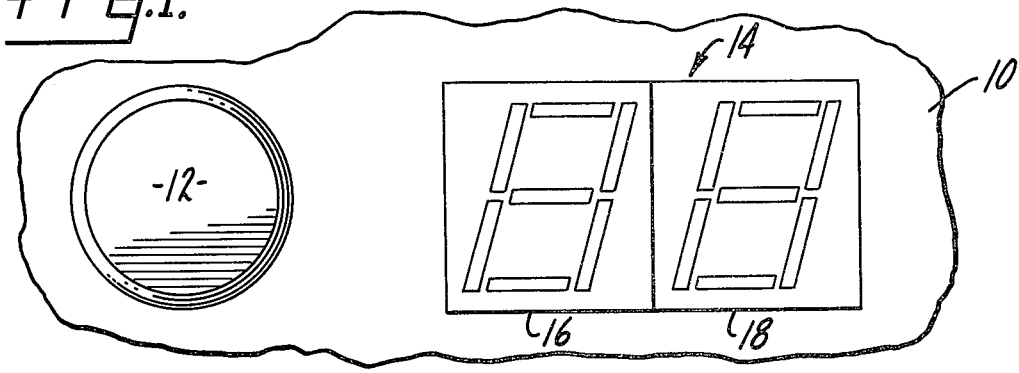
FIG. 1 is a front view of a television tuner with the channel indicator of the present invention displayed therewith.

In FIG. 1 a housing indicated at 10 may include a conventional television tuner. The channel selector shaft is indicated at 12 and the channel indicator means is indicated at 14. As shown herein, there are a pair of visual indicators which may take a variety of forms, for example Nixie tubes are satisfactory. The tubes are indicated at 16 and 18, with tube 16 providing an indication of the most significant digit and tube 18 providing an indication of the least significant digit. For example, if the channel selector shaft 12 is tuned to channel 32, indicator 16 would display a 3 and indicator 18 would display a 2.

Figure 2:
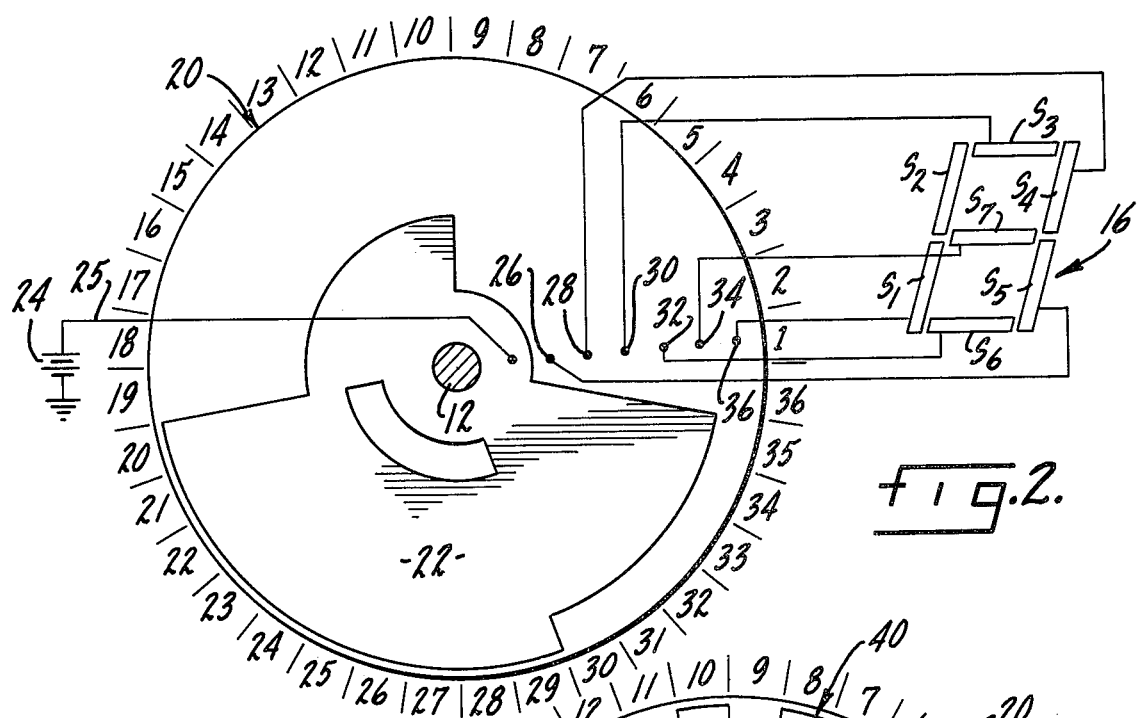
FIG. 2 is an electrical diagram of one of the coded surfaces used to provide the most significant digit in the channel indicator.
Figure 3:
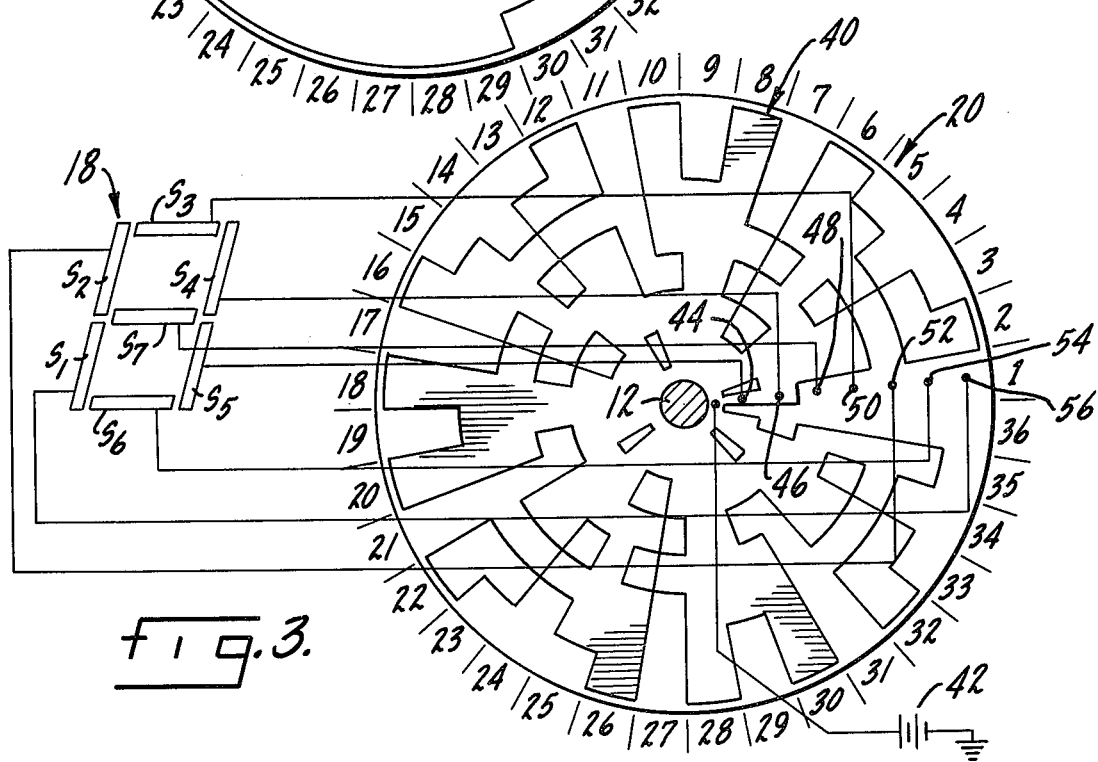
FIG. 3 is an electrical diagram of the second coded surface used to provide the least significant digit of the channel display.

FIGS. 2 and 3 show electrically conductive coded areas which may be positioned on opposite sides of a single disc with the disc being fastened to the channel selector shaft. Such coded discs may be made in a variety of different ways, but what is important is to provide conductive and non-conductive areas, as shown, so that at each position of the channel selector shaft a voltage will be applied to different portions of the readout devices to thus change the display. Although the two coded surfaces may be applied to opposite sides of a single disc, it should be realized that in some applications the coded surfaces may be applied to spaced discs, but yet discs which are fixed to th same channel selector shaft.

In FIG. 2 a coded surface is indicated generally at 20 and there are 36 different positions indicated by the radial lines 1 through 36. The coded area of the electrically conductive area is indicated at 22 and has the particular configuration to provide the digits 1, 2 or 3. A source of voltage is indicated diagrammatically at 24 and is connected by a line 25 directly to the center of the coded surface 22 or to a common point on the coded surface. Indicator 16 has seven different display bars designated as S1 through S7. Each of the display bars used has its own independent pickup designated at 26, 28, 30, 32, 34 and 36. The pickup devices are radially spaced from each other with pickup device 26 being closer to the center of the coded surface and pickup device 36 being furthest away. The coded surface of FIG. 2 has six-bit logic, rather than the seven-bit logic of the coded surface of FIG. 3 as bar S2 does not have to be illuminated for any one of the numbers 1, 2 or 3. Since coded surface 20 is only for the most significant digit, it is not necessary to use bar S2 of the indicator device 16.

In the channel positions 1–9, none of the pickup devices will be in contact with the electrically-conductive portions of coded surface 22 and hence there will be no numerical display on device 16. As soon as the channel selector shaft is turned to channel 10, it can be seen that pickup devices 26 and 28 will be electrically connected to the source of voltage 24 so that bars S4 and S5 will receive a voltage and thus be illuminated to show 1 on the indicator 16. In like manner, when the channel selector shaft has been turned to channel 20, pickup devices 28 through 36 will all be connected to the source of voltage to display a 2 at the indicator 16. For channel 30 and beyond, bars 26–34 will be connected to the source of voltage to display a 3 at the indicator.

Turning to FIG. 3, the coded surface indicated generally at 40 is substantially different from the coded surface shown in FIG. 2. The indicator is the same, although in this case all seven bars have a pickup device. A source of voltage is indicated at 42 and is connected to the center of the coded surface. The individual pickup devices are indicated at 44 through 56 with the result that the coded surface of FIG. 3 provides seven-bit logic. Indicator 18 will display the numbers 1 through 9 for channels 1–9, the numbers 0 through 9 for channels 10–19, the numbers 0 through 9 for channels 20–29 and the numbers 0 through 6 for channels 30–36.

Each of the coded surfaces shown in FIGS. 2 and 3 will be fixed to the channel selector shaft, either by being placed on opposite sides of the same disc, or on separate discs. The coded surfaces will rotate with the channel selector shaft and the diagrammatically illustrated pickup devices will be connected to the source of voltage, which may be the same for both discs, depending upon the particular position of the channel selector shaft. The pickup devices in turn are directly connected to the display device, thus eliminating the conventional character generator.

Whereas the preferred form of the invention has been shown and described herein, it should be realized that there may be many modifications, substitutions and alterations thereto.

I claim:

1. In a television channel indicator, a rotatable shaft, a pair of electricially conductive coded surfaces, means supporting said coded surfaces for rotation with said shaft, a pair of electricially-operated visual read-out devices, each having independent areas capable of being energized to display the digits 0–9, a source of voltage connected to a common area on each of said coded surfaces, pick-up means for each of said independent areas and each of said pick up means being directly connected to an independent area, said pick-up means being positioned to contact said coded surfaces such that the various independent areas are energized in said readout devices to provide a different visual numerical indication of shaft position and TV channel selection at each position of the shaft.

2. The structure of claim 1 further characterized in that each of said readout devices have seven independent areas.

3. The structure of claim 1 further characterized in that said coded surfaces are positioned on opposite sides of a disc, with said disc being fixed to said shaft for rotation therewith.

* * * * *